United States Patent [19]
Cho et al.

[11] Patent Number: 5,392,317
[45] Date of Patent: Feb. 21, 1995

[54] METHOD AND APPARATUS EXTRACTING PULSE SIGNAL

[75] Inventors: Yoshiki Cho; Tetsu Tashiro, both of Hyogo, Japan

[73] Assignee: Mitsubishi Kenki Kabushiki Kaisha, Tokyo, Japan

[21] Appl. No.: 839,524

[22] Filed: Feb. 20, 1992

[30] Foreign Application Priority Data

Feb. 22, 1991 [JP] Japan .................. 3-060957

[51] Int. Cl.6 .............. H04L 25/06; H04L 25/10
[52] U.S. Cl. ..................... 375/76; 330/149; 327/72; 327/98; 327/558
[58] Field of Search ............ 375/76, 75; 307/358, 307/350; 330/302, 149; 328/149

[56] References Cited

U.S. PATENT DOCUMENTS

| 4,339,727 | 7/1982 | Kage et al. | 375/76 X |
| 5,175,748 | 12/1992 | Takahash | 375/76 X |

FOREIGN PATENT DOCUMENTS

| 59-133726 | 8/1984 | Japan | H03K 5/08 |
| 61-310139 | 12/1986 | Japan | H03K 5/08 |
| 62-126708 | 6/1987 | Japan | H03K 5/08 |
| 63-181521 | 7/1988 | Japan | H03K 5/08 |
| 63-232516 | 9/1988 | Japan | H03K 5/08 |
| 2-215221 | 8/1990 | Japan | H03K 5/08 |
| 2-265315 | 10/1990 | Japan | H03K 5/08 |
| 3-190319 | 8/1991 | Japan | H03K 5/08 |

Primary Examiner—Stephen Chin
Assistant Examiner—Tesfaldet Bocure
Attorney, Agent, or Firm—Townsend and Townsend Khourie and Crew

[57] ABSTRACT

A pulse-signal extracting method and apparatus which are capable of generating an accurate pulse output even if the pulse input signal greatly pulsates due to a low-frequency noise component. A predetermined offset voltage is added to the input signal where the low-frequency noise component is superimposed on a pulse waveform which is the signal component so as to obtain an amplified signal. This amplified signal is inputted to a low-pass filter so as to output only the amplified flow-frequency component, and the original input signal is compared with the amplified low-frequency component in a comparator so as to extract the pulse waveform, which is the signal component, on the basis of the comparison result.

3 Claims, 6 Drawing Sheets

METHOD AND APPARATUS EXTRACTING PULSE SIGNAL

BACKGROUND OF THE INVENTION

1. Field of the Invention

The present invention relates to a pulse-signal extracting method and apparatus for removing a noise from an input signal, where a low-frequency component is introduced as the noise into a pulse waveform, so as to derive the pulse waveform.

2. Description of the Prior Art

FIG. 7 shows a prior art arrangement of a semiconductor integrated circuit having a function to derive a pulse signal from a signal where a low-frequency component is superimposed as a noise on a pulse waveform. In FIG. 7, to a comparator 1 there are inputted an input signal PulseIn (which will be referred hereinafter to as a pulse input signal) A where a low-frequency component is superimposed as a noise on a signal component having a pulse waveform and further inputted a comparison voltage VREF (which will be referred hereinafter to as a reference voltage) B. The reference voltage B is set to be an optimal constant DC voltage Eo. Further, the comparator 1 generates a pulse-waveform output PulseOut (which will be referred hereinafter to as a pulse output) C. The comparator 1 compares the level of the reference voltage Eo with the level of the pulse input signal A so as to generate a "H" level when the former is higher than the latter and generate a "L" level when the former is lower than the latter.

Secondly a description will be made hereinbelow in terms of the operation. FIG. 9 shows a pulse output C obtained when a pulse input signal A and a reference voltage Eo illustrated in FIG. 8 are inputted to the comparator 1 and further shows an expected pulse output D. As illustrated in FIG. 8, the pulse input signal A is a pulsating-current signal where a low-frequency component is superimposed as a noise, and the reference voltage Eo is inputted as a constant voltage. Thus, the comparator 1 outputs the pulse output C as illustrated at the upper side of FIG. 9. Here, the pulse output C is required to include pulses mP and mQ in an interval from a to b as being similar to the expected pulse output D illustrated at the lower side of FIG. 9. However, since the pulse input signal A becomes a pulsating current signal due to the superimposition of the low-frequency component to generate an interval where the level of the pulse input signal A becomes lower than the level of the reference voltage Eo, the pulses mP and mQ expected are not generated from the comparator 1.

Since the amplitude S of the pulsation due to the noise is relatively large as compared with the height h of the pulse of the signal component, that is, since the the entire pulse input signal greatly pulsates due to the noises which is the low-frequency component, there is a problem that the pulse waveform required is not outputted because of no detection of the pulses or that difficulty is encountered to adequately set the comparison voltage to allow the detection of the pulses.

SUMMARY OF THE INVENTION

The present invention has been developed in order to remove the above-described problems, and it is therefore an object of this invention to provide a pulse-signal extracting method and apparatus which are capable of obtaining an adequate pulse output even if the pulse input signal greatly pulsates due to the low-frequency-component noise.

In accordance with the present invention, there is provided a pulse extracting apparatus comprising an amplifier 3 for amplifying an input signal A where a low-frequency component N which is a noise is superimposed on a pulse waveform P which is an effective signal so as to rise and output the voltage of the low-frequency component, a low-pass filter 4 responsive to the amplified input signal AA for cutting off the high-frequency pulse waveform P to output a pulsating-current voltage AF whose principal component is the low-frequency component N, and a comparator 1 for comparing the pulsating-current voltage AF with the original input signal AA to output a pulse waveform G only in accordance with the comparison result.

Further, according to this invention there is provided a pulse extracting method comprising the steps of amplifying an input signal where a low-frequency component which is a noise is superimposed on a pulse waveform which is an effective signal so as to rise the voltage of the low-frequency component, inputting the amplified input signal to a low-pass filter having a function to cut off a high frequency so as to remove the pulse waveform to output a pulsating-current voltage whose principal component is the low-frequency component, and inputting the original input signal and the pulsating-current voltage to a comparator to derive the pulse waveform only in accordance with the comparison result.

The input signal A is amplified through the amplifier 3 so as to rise the voltage of the low-frequency component. This amplified input signal is inputted to the low-pass filter 4 for cutting off a high-frequency component so as to remove the pulse waveform P of the signal to thereby output the pulsating-current voltage AF whose principal component is the low-frequency component N. Secondly, the original input signal A and the pulsating-current voltage AF are respectively inputted to the comparator 1 so as to extract the pulse waveform G of the signal only in accordance with the comparison result.

The above and other objects, features, and advantages of the Invention will become more apparent from the following description when taken in conjunction with the accompanying drawings.

DESCRIPTION OF THE PREFERRED EMBODIMENT

Figure 1:
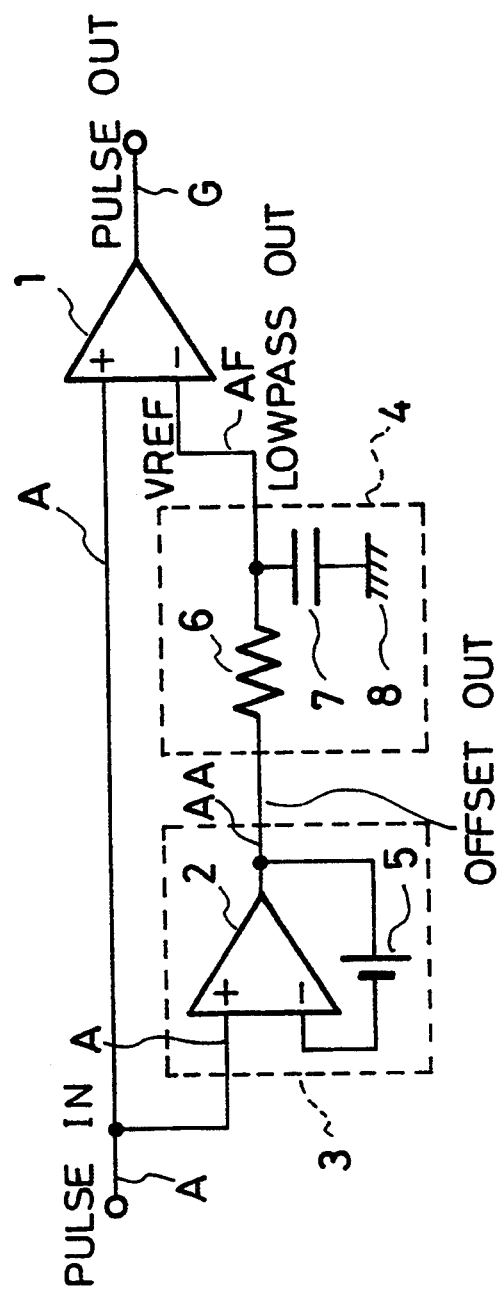
FIG. 1 is a circuit diagram of a pulse extracting apparatus according to an embodiment of the present invention.
Figure 2:
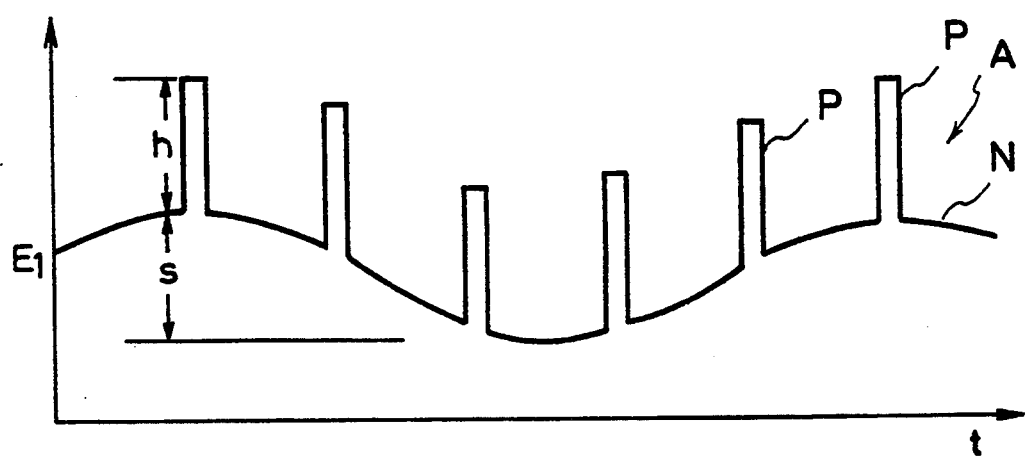
FIG. 2 is an illustration of an operation waveform in the FIG. 1 circuit.

The present invention will be described hereinbelow with reference to the drawings. In FIG. 1, numeral I represents a comparator, 2 designates an amplifier, 3 depicts a differential amplifier, 4 indicates a low-pass filter, 5 is a direct-current voltage source, 6 represents a resistor, 7 designates a capacitor, and 8 denotes the ground. The comparator 1 is arranged to output "H" level when the input level of its (+) input terminal is higher than the input level of its (−) input terminal and output "L" level when the input level of its (+) input terminal is lower than the input level of its (−) input terminal. The differential amplifier 3 has two input terminals to amplify the difference between the input levels of the two input terminals. If one input is a constant voltage, the differential amplifier 3 outputs as an amplified voltage the voltage obtained by adding predetermined times of the constant voltage as an offset voltage to the other input voltage. In FIG. 1, this offset voltage is determined by the voltage Eo of the voltage source. The low-pass filter 4 is composed of a RC circuit and can be arranged to remove a high frequency and desirably set the cut-off frequency if adequately selecting the resistance value and electrostatic capacity. That is, the RC of the low-pass filter 4 is set so as to permit the cut-off of a high-frequency component and allow the transmission of a low-frequency component which consists of a noise component. A pulse input signal A as illustrated in FIG. 2 is given to the (+) input terminal of the comparator 1 and amplifier 2. This input signal A is obtained with a low-frequency noise component N is superimposed on a high-frequency signal component P. The low-frequency noise component N includes a direct-current component and the signal component P comprises a pulse component.

Figure 3:
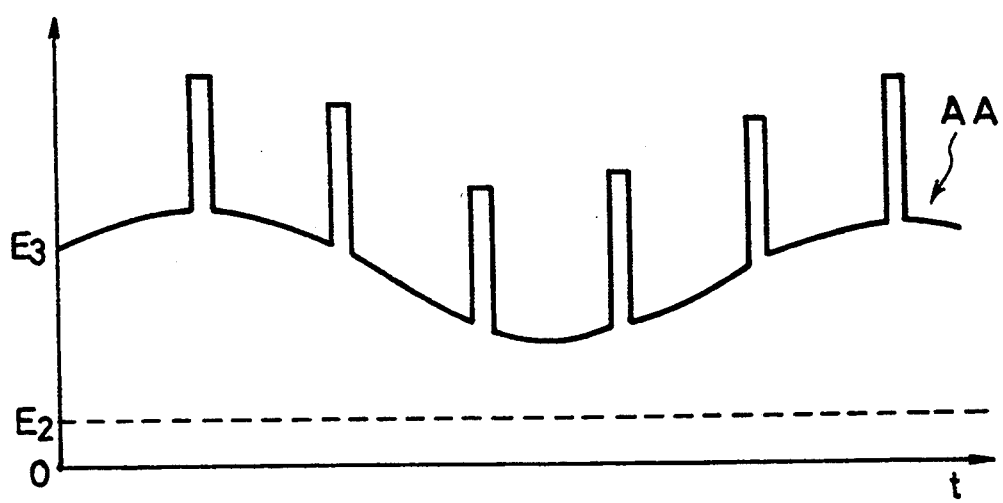
FIG. 3 is an illustration of an operation waveform in the FIG. 1 circuit.

Secondly, a description will be made hereinbelow in terms of the operation. First, the pulse input signal A as illustrated in FIG. 2 is inputted to the (+) input terminal which is one input terminal of the amplifier 2 and the constant voltage E2 is applied from the voltage source 5 to the other (−) input terminal of the amplifier 2. Thus, the differential amplifier 3 outputs an amplified signal AA (FIG. 3) which is obtained by adding the FIG. 2 pulse input signal A to the voltage E2 which is a direct-current component. That is, the voltage amplified at one representative point (to) becomes E3=E2+E1. More specifically, the signal AA obtained by always adding the offset voltage E2 to the pulse input signal A is outputted from the differential amplifier 3. In this amplified signal AA, the offset voltage E2 is added to both the noise component N and signal component P.

Figure 4:
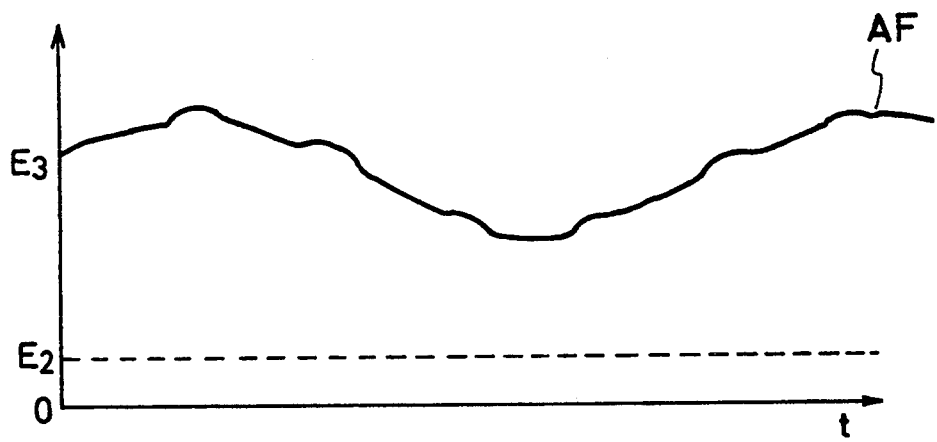
FIG. 4 is an illustration of an operation waveform in the FIG. 1 circuit.

Thereafter, this amplified signal AA is inputted to one end of the resistor 6 of the low-pass filter 4 so that the signal component P which is a high-frequency component is removed and the low-frequency signal AF (FIG. 4) is outputted from the connection point between the other end of the resistor 6 and the capacitor 7. Since the high frequency which is the pulse component (signal component) P is cut off in accordance with the frequency characteristic of the low-pass filter 4, this low-frequency signal AF is composed of the passed low-frequency pulsating-current component.

Figure 5:
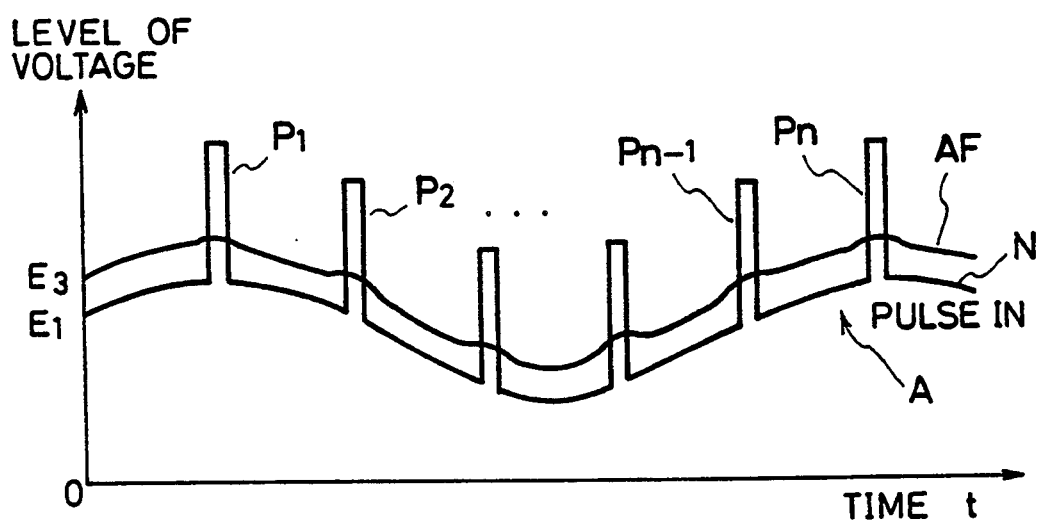
FIG. 5 is an illustration of an operation waveform in the FIG. 1 circuit.
Figure 6:
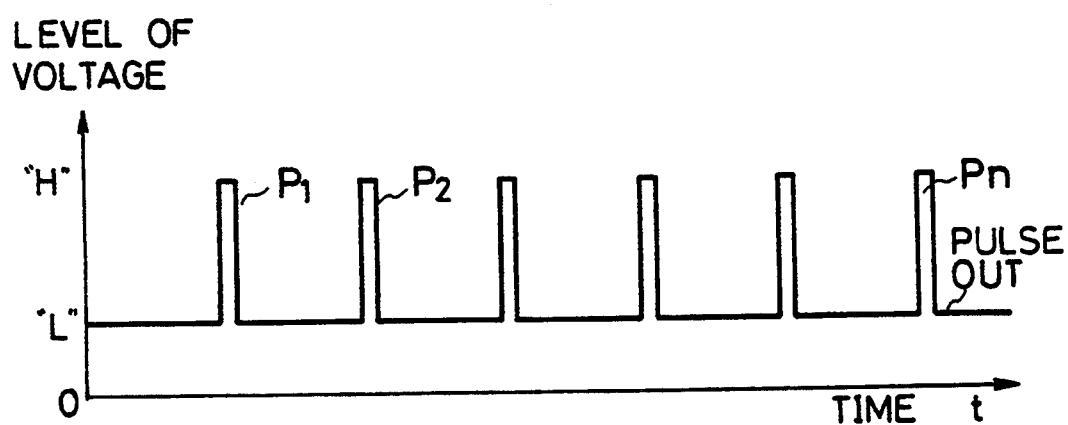
FIG. 6 is an illustration of an operation waveform in the FIG. 1 circuit.
Figure 7:
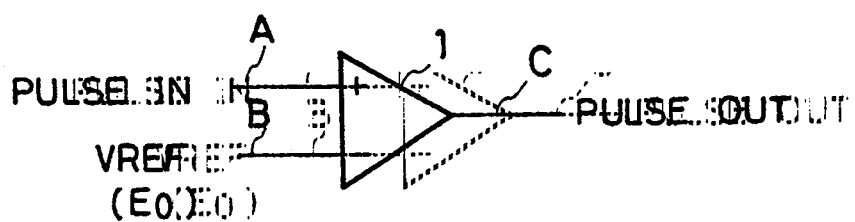
FIG. 7 is an illustration of a prior art circuit.
Figure 8:
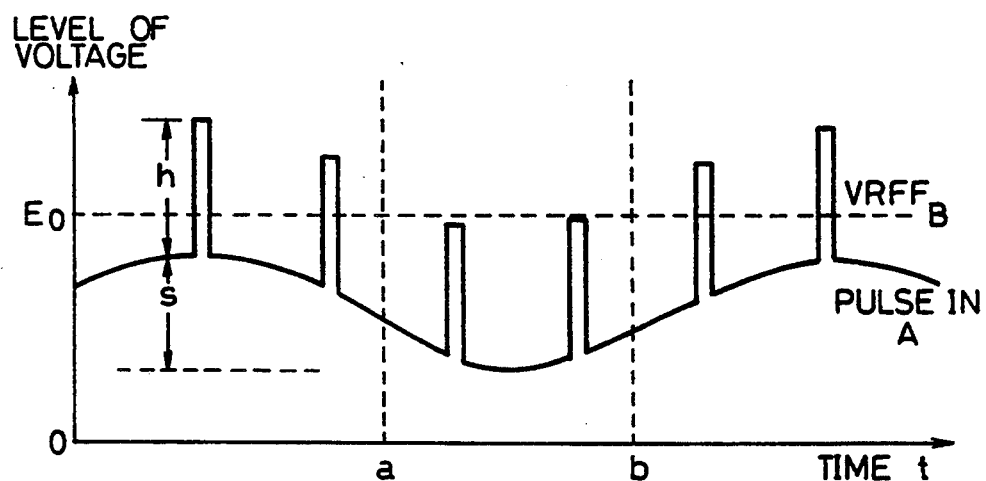
FIG. 8 is an illustration of an operation waveform in the prior art circuit.
Figure 9:
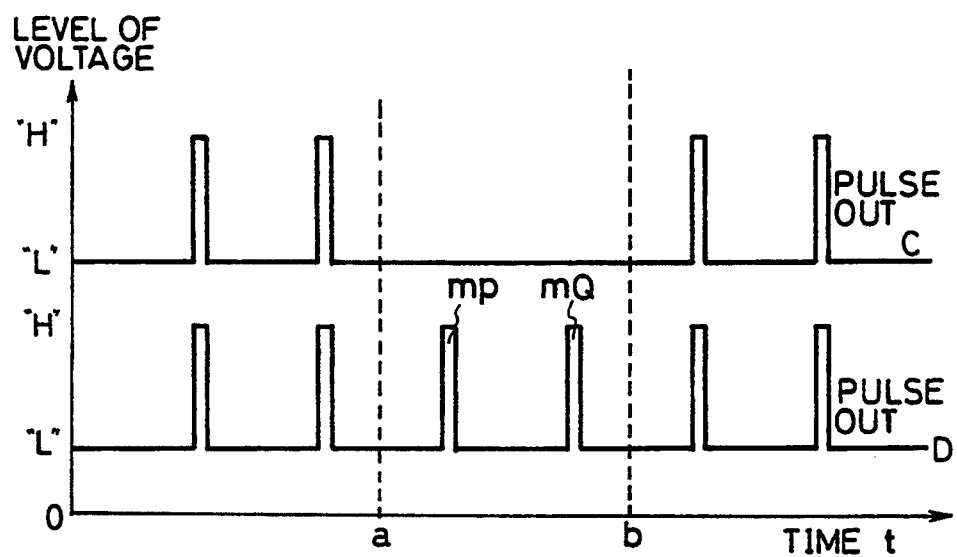
FIG. 9 is an illustration of an operation waveform in the prior art circuit.

This low-frequency signal AF is applied as the reference voltage to the (−) input terminal which is one input terminal of the comparator 1, and the original pulse input signal A is given to the other (+) input terminal thereof. Thus, as shown in FIG. 5, in the calculation of the comparator 1, the low-frequency signal AF is compared with the pulse input signal A. The voltage of the pulsating-current component of the low-frequency signal AF is always higher by the offset voltage E2 than the pulsating-current component (low-frequency noise component N) of the pulse input signal A and lower than the voltages of the pulses P1, P2, ..., Pn which constitute the signal components. As a result, the comparator 1 can accurately output the high-frequency pulse component as illustrated in FIG. 6. The comparator 1 does not output the low-frequency noise component N but outputs only the pulses P1, P2 ..., Pn which constitute the signal component. In this case, if the offset voltage E2 is set in conjunction with the pulse height h (voltage) of the pulse input signal A and the amplitude S of the low-frequency pulsation of the noise component, the entire pulse waveform is detectable whereby it is possible to always obtain an accurate pulse output.

Here, it is also appropriate that the differential amplifier for adding the offset voltage is constructed as a simple offset voltage generating circuit which is arranged to rise voltage through a resistor. If being constructed as a LSI, this pulse signal extracting apparatus is applicable to the character-broadcast receiving TV or the like. Further, since the characteristic of the low-frequency noise varies in accordance with the environment of the electromagnetic electric field, the low-pass filter characteristic is determined experimentally in accordance with the environment.

As described above, according to this invention, the offset voltage generating circuit for adding an adequate offset voltage to the pulse input signal is coupled in series to the low-pass filter for deriving the superimposed low-frequency noise component, and the output signal thereof is inputted as the comparison voltage to the comparator. Thus, it is possible to obtain an accurate pulse output even if the pulse-waveform input signal greatly pulsates due to the low-frequency noise component.

What is claimed is:

1. A pulse signal extracting apparatus comprising:
    an amplifier having first and second input terminals, the amplifier for amplifying an input signal having a low-frequency noise component superimposed on an effective signal having a pulse waveform, provided at the first input terminal thereof and a constant DC voltage provided at the second input terminal thereof, amplifying the difference between said input signal and said DC voltage and outputting an amplified signal;
    a low-pass filter responsive to the amplified signal from said amplifier for cutting off the high-frequency pulse waveform from the amplified signal to output a pulsating-current voltage whose principal component is the low-frequency noise component; and
    a comparator for comparing said pulsating-current voltage with the input signal to output only said pulse waveform on the basis of the comparison result.

2. A pulse signal extracting method comprising the steps of:
    amplifying the difference between a constant DC voltage and an input signal, said input signal having a low-frequency noise component superimposed on an effective signal having a pulse waveform, to output an amplified signal;

inputting the amplified signal to a low-pass filter for cutting off a high frequency so as to remove said pulse waveform to output a pulsating-current voltage whose principal component is the low-frequency noise component; and inputting the original input signal and said pulsating-current voltage to a comparator to output only said pulse waveform on the basis of the comparison result.

3. A pulse signal extracting apparatus comprising:

means for amplifying the difference between a constant DC voltage and an input signal having a low frequency noise component superimposed on a effective signal having a pulse waveform, to output an amplified signal;

means responsive to the amplified signal for cutting off the high-frequency pulse waveform to output a cut-off voltage signal whose principal component is the low-frequency noise component; and means for comparing said cut-off voltage signal with said input signal to output said pulse waveform on the basis of the comparison result.

* * * * *